US012622298B2

(12) United States Patent
Yeh et al.

(10) Patent No.: US 12,622,298 B2
(45) Date of Patent: May 5, 2026

(54) ELECTRONIC PACKAGE, PACKAGING SUBSTRATE AND FABRICATING METHOD THEREOF

(71) Applicant: SILICONWARE PRECISION INDUSTRIES CO., LTD., Taichung City (TW)

(72) Inventors: Chan-Yu Yeh, Taichung City (TW); Yu-Cheng Pai, Taichung City (TW); Yuan-Ping Yeh, Taichung City (TW); Yuan-Chang Ni, Taichung City (TW); Meng-Jou He, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 386 days.

(21) Appl. No.: 18/325,846

(22) Filed: May 30, 2023

(65) Prior Publication Data

US 2024/0282689 A1     Aug. 22, 2024

(30) Foreign Application Priority Data

Feb. 18, 2023    (TW) ................................. 112105985

(51) Int. Cl.
*H10W 70/65* (2026.01)
*H10P 72/70* (2026.01)
(Continued)

(52) U.S. Cl.
CPC ............. *H10W 70/65* (2026.01); *H10P 72/74* (2026.01); *H10W 70/095* (2026.01);
(Continued)

(58) Field of Classification Search
CPC . H01L 23/12–15; H01L 23/498–49894; H01L 2224/02–09519; H01L 23/49822; H01L 2224/05001–05499; H01L 2224/0554–05999; H01L 2224/05147; H01L 2224/05247; H01L 2224/05347; H01L 2224/05447; H01L 2224/05655; H01L 2224/05755; H01L 2224/05855; H01L 2224/05955; H10W 70/65; H10W 70/095; H10W 72/072; H10W 72/07236; H10W 72/287; H10W 90/724;
(Continued)

(56) References Cited

U.S. PATENT DOCUMENTS

2008/0179740 A1* 7/2008 Liao .................. H01L 23/49816
257/738
2008/0308917 A1* 12/2008 Pressel ................ H10W 70/614
257/E23.116
(Continued)

*Primary Examiner* — Scott B Geyer
(74) *Attorney, Agent, or Firm* — Studebaker Brackett PLLC

(57) ABSTRACT

An electronic package, a packaging substrate and a fabricating method are provided, in which a conductive bump pad is formed on an electrical contact pad of the packaging substrate, so that when an electronic element is bonded to the packaging substrate via a solder material in a flip-chip process, the conductive bump pad can guide the flow of the solder material. Therefore, the problem of empty soldering caused by the solder material not effectively contacting with the electrical contact pad can be avoided.

20 Claims, 5 Drawing Sheets

(51) Int. Cl.

| | | |
|---|---|---|
| *H10W 70/05* | (2026.01) | |
| *H10W 72/00* | (2026.01) | |
| *H10W 72/20* | (2026.01) | |
| *H10W 90/00* | (2026.01) | |

(52) U.S. Cl.
CPC ....... *H10P 72/7424* (2026.01); *H10W 72/072* (2026.01); *H10W 72/07236* (2026.01); *H10W 72/287* (2026.01); *H10W 90/724* (2026.01)

(58) Field of Classification Search
CPC . H10W 70/05; H10W 70/635; H10W 70/685; H10W 72/20; H10W 90/701; H10W 20/20; H10W 70/041; H10W 74/01; H10W 74/117

See application file for complete search history.

(56) References Cited

U.S. PATENT DOCUMENTS

| | | | | |
|---|---|---|---|---|
| 2009/0127703 A1* | 5/2009 | Lee | ............ | H01L 24/05 |
| | | | | 257/737 |
| 2010/0078813 A1* | 4/2010 | Okayama | ............ | H01L 24/11 |
| | | | | 257/738 |
| 2010/0200988 A1* | 8/2010 | Farooq | ............ | H01L 24/13 |
| | | | | 174/126.1 |
| 2010/0258953 A1* | 10/2010 | Takeda | ............ | H01L 23/49816 |
| | | | | 257/782 |
| 2011/0068484 A1* | 3/2011 | Meyer | ............ | H10W 70/614 |
| | | | | 257/E21.59 |
| 2012/0313240 A1* | 12/2012 | Cheng | ............ | H10W 70/685 |
| | | | | 257/737 |
| 2014/0264927 A1* | 9/2014 | Yu | ............ | H01L 24/03 |
| | | | | 438/631 |
| 2014/0374921 A1* | 12/2014 | Yu | ............ | H01L 23/13 |
| | | | | 257/777 |
| 2015/0144384 A1* | 5/2015 | Ho | ............ | H10W 70/093 |
| | | | | 174/257 |
| 2015/0179592 A1* | 6/2015 | Jain | ............ | H01L 23/528 |
| | | | | 257/738 |
| 2016/0155716 A1* | 6/2016 | Sun | ............ | H01L 23/3114 |
| | | | | 174/262 |
| 2016/0190079 A1* | 6/2016 | Liao | ............ | H01L 24/81 |
| | | | | 257/737 |
| 2016/0225706 A1* | 8/2016 | Cho | ............ | H10W 70/685 |
| 2018/0269172 A1* | 9/2018 | Katkar | ............ | H01L 24/08 |
| 2019/0013285 A1* | 1/2019 | Murayama | ............ | H05K 1/181 |
| 2021/0296219 A1* | 9/2021 | Yen | ............ | H10P 72/74 |
| 2022/0392861 A1* | 12/2022 | Chen | ............ | H10P 72/74 |

* cited by examiner

ELECTRONIC PACKAGE, PACKAGING SUBSTRATE AND FABRICATING METHOD THEREOF

BACKGROUND

1. Technical Field

The present disclosure relates to a semiconductor packaging process, and more particularly, to an electronic package, a packaging substrate and a fabricating method thereof.

2. Description of Related Art

With the vigorous development of the electronic industry, electronic products tend to be lighter, thinner and smaller in form, and are developing toward high performance, high function and high speed in terms of function. Besides, in order to meet the high integration and miniaturization requirements of semiconductor devices, packaging substrates with high-density and fine-pitch circuits are usually used in the packaging process.

As shown in FIG. 1, in a conventional semiconductor package 1, a packaging substrate 10 having a plurality of electrical contact pads 100 is flip-chip bonded to a semiconductor chip 11 via solder bumps 13, and then the solder bumps 13 are covered by an underfill 14.

However, during the reflow process, part of solder bumps 130 are prone to overflow to other places to bridge two adjacent ones of the electrical contact pads 100, resulting in electrical short circuit of the semiconductor chip 11.

In addition, part of solder bumps 131 are likely to be displaced due to being squeezed by the semiconductor chip 11 during the reflow process, so that the solder bumps 131 are empty (e.g., empty soldering) and cannot be accurately connected to the electrical contact pads 100, resulting in the electrical disconnection of the semiconductor chip 11.

Therefore, how to overcome the aforementioned drawbacks of the prior art has become an urgent issue to be addressed at present.

SUMMARY

In view of the various shortcomings of the prior art, the present disclosure provides a packaging substrate, which comprises: a routing structure having a first surface and a second surface opposing the first surface, and comprising an insulating layer and a routing layer formed on the insulating layer; a circuit layer embedded in the insulating layer of the second surface of the routing structure and electrically connected to the routing layer, wherein the circuit layer has a plurality of electrical contact pads exposed from the insulating layer; and a conductive bump pad disposed on at least one of the plurality of electrical contact pads, wherein a width of the conductive bump pad is less than a width of each of the electrical contact pads, and a material for forming the conductive bump pad is different from a material for forming the electrical contact pads.

The present disclosure also provides a method of fabricating a packaging substrate, the method comprises: providing a carrier having a metal layer; forming at least a conductive bump pad on the metal layer, wherein a material for forming the conductive bump pad is different from a material for forming the metal layer; forming a circuit layer on the metal layer, wherein the circuit layer has a plurality of electrical contact pads, and the conductive bump pad is covered by at least one of the plurality of electrical contact pads, wherein the material for forming the conductive bump pad is different from a material for forming the electrical contact pads; forming a routing structure on the metal layer, wherein the routing structure has a first surface and a second surface opposing the first surface, wherein the routing structure comprises an insulating layer formed on the metal layer and the circuit layer, and a routing layer formed on the insulating layer and electrically connected to the circuit layer; and removing the carrier and the metal layer thereon to expose the electrical contact pads of the circuit layer and the conductive bump pad, wherein a width of the conductive bump pad is less than a width of each of the electrical contact pads.

In the aforementioned packaging substrate and method, the material for forming the conductive bump pad is nickel, and the material for forming the electrical contact pads is copper.

In the aforementioned packaging substrate and method, the conductive bump pad is embedded in each of the electrical contact pads.

In the aforementioned packaging substrate and method, the insulating layer is formed with a recess at each of the electrical contact pads, and the conductive bump pad is located in the recess. For instance, a distance between the conductive bump pad and a wall of the recess is greater than one third of the width of each of the electrical contact pads.

In the aforementioned packaging substrate and method, a width of the insulating layer between two adjacent ones of the plurality of electrical contact pads is greater than one third of the width of each of the electrical contact pads.

In the aforementioned packaging substrate and method, the conductive bump pad has a pad surface flush with the second surface of the routing structure.

In the aforementioned packaging substrate and method, the conductive bump pad has a pad surface lower than the second surface of the routing structure.

The present disclosure also provides an electronic package, which comprises: the aforementioned packaging substrate; and an electronic element disposed on the plurality of electrical contact pads via a plurality of conductive bumps, wherein at least one of the conductive bumps is bonded to the conductive bump pad.

The present disclosure further provides a method of fabricating an electronic package, the method comprises: providing the aforementioned packaging substrate; and disposing an electronic element on the plurality of electrical contact pads via a plurality of conductive bumps, wherein at least one of the conductive bumps is bonded to the conductive bump pad.

In the aforementioned electronic package and method, the conductive bumps are made of solder material.

As can be seen from the above, in the electronic package, the packaging substrate and the fabricating method thereof of the present disclosure, the conductive bump pads are disposed on the electrical contact pads and the pad surfaces of the conductive bump pads are not higher than the insulating layer, so that when the electronic element is bonded to the packaging substrate via a flip-chip method, the conductive bump pads can guide the flow of the solder material when reflowing the conductive bumps. Hence, compared with the prior art, in the fabricating process of the electronic package of the present disclosure, the problem of empty soldering caused by the conductive bumps not effectively contacting the electrical contact pads can be avoided, and the problem of electrical short circuit caused by the conductive bump connecting to two adjacent ones of the electrical contact pads can also be prevented.

DETAILED DESCRIPTION

Figure 1:
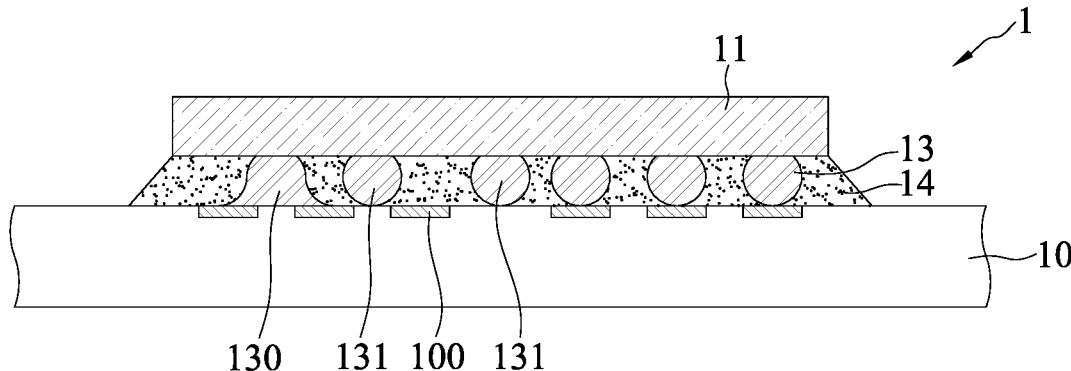
FIG. 1 is a schematic cross-sectional view of a conventional semiconductor package.

The following describes the implementation of the present disclosure with examples. Those familiar with the art can easily understand the other advantages and effects of the present disclosure from the content disclosed in this specification.

It should be noted that the structures, ratios, sizes, etc. shown in the drawings appended to this specification are to be construed in conjunction with the disclosure of this specification in order to facilitate understanding of those skilled in the art. They are not meant to limit the implementations of the present disclosure, and therefore have no substantial technical meaning. Any modifications of the structures, changes of the ratio relationships, or adjustments of the sizes, are to be construed as falling within the range covered by the technical content disclosed herein to the extent of not causing changes in the technical effects created and the objectives achieved by the present disclosure. Meanwhile, terms such as "on," "first," "second," "a," "one," and the like recited herein are for illustrative purposes, and are not meant to limit the scope in which the present disclosure can be implemented. Any variations or modifications to their relative relationships, without changes in the substantial technical content, should also to be regarded as within the scope in which the present disclosure can be implemented.

FIG. 2A to FIG. 2F are schematic cross-sectional views illustrating a method of fabricating an electronic package 2 according to the present disclosure.

Figure 2A:
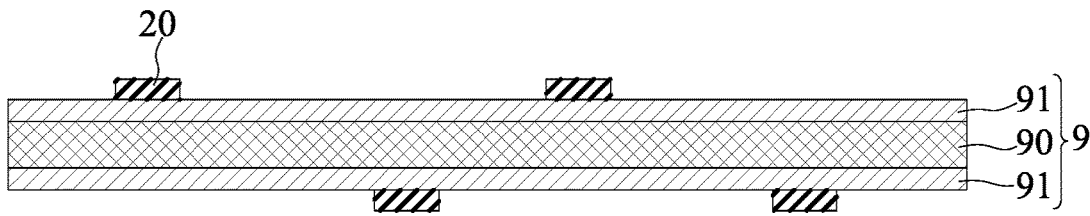
FIG. 2A to FIG. 2F are schematic cross-sectional views illustrating a method of fabricating an electronic package according to the present disclosure.

As shown in FIG. 2A, a plurality of conductive bump pads 20 are formed on both opposing two sides of a carrier 9.

In an embodiment, the carrier 9 comprises a plate body 90 and a metal layer 91 formed on two sides of the plate body 90. For instance, the plate body 90 is made of semiconductor material (such as silicon or glass), on which the metal layer 91 such as titanium/copper is sequentially formed by, for example, coating.

In addition, the conductive bump pads 20 are metal bodies such as nickel, which are patterned on the metal layer 91. For instance, the material for forming the metal layer 91 is different from the material for forming the conductive bump pads 20.

Figure 2B:
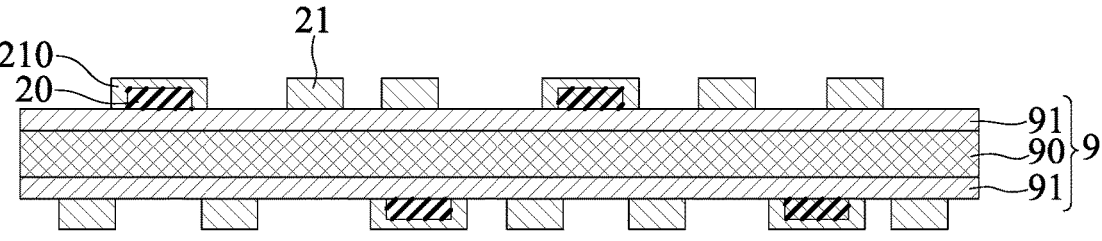

As shown in FIG. 2B, a circuit layer 21 is formed on the metal layer 91 of the carrier 9, and the conductive bump pads 20 are covered by the circuit layer 21.

In an embodiment, the circuit layer 21 has a plurality of electrical contact pads 210, such that at least one of the plurality of electrical contact pads 210 is in contact with and covers the conductive bump pad 20.

Moreover, the circuit layer 21 is formed by electroplating metal (such as copper) or other fabricating methods, and the material for forming the circuit layer 21 is different from the material for forming the conductive bump pads 20.

Figure 2C:
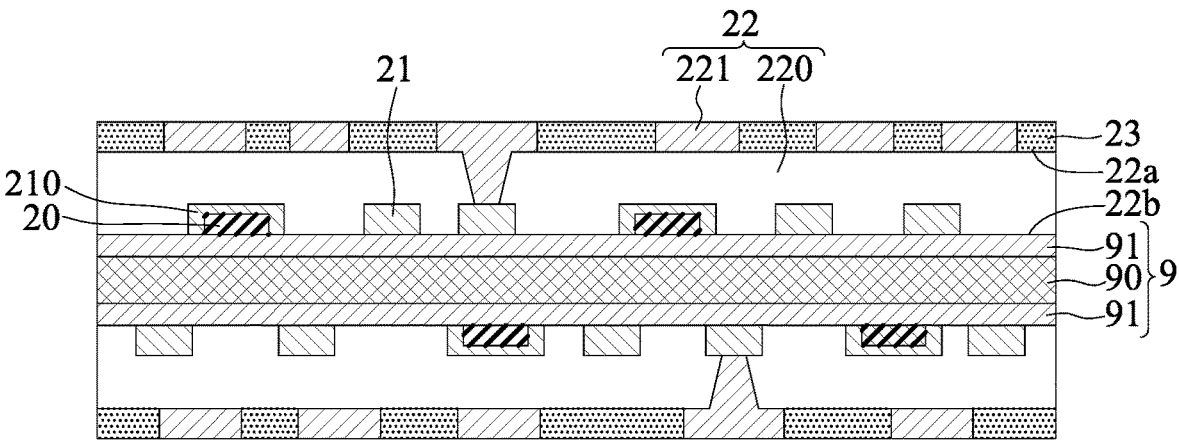

As shown in FIG. 2C, a routing structure 22 (e.g., a wiring structure) is respectively formed on the metal layer 91 on both sides of the carrier 9, so that the routing structure 22 is electrically connected to the circuit layer 21.

In an embodiment, each of the routing structures 22 is defined to have a first surface 22a and a second surface 22b opposing the first surface 22a, such that the routing structure 22 is bonded onto the carrier 9 via the second surface 22b thereof.

Furthermore, the routing structure 22 comprises at least one insulating layer 220 formed on the metal layer 91 and the circuit layer 21, and a routing layer 221 formed on the insulating layer 220 and electrically connected to the circuit layer 21, such as of a redistribution layer (RDL) specification. For instance, the insulating layer 220 is a dielectric layer made of such as polybenzoxazole (PBO), polyimide (PI), prepreg (PP) with glass fiber, or other dielectric materials, and the material for forming the routing layer 221 is copper.

In addition, an insulating protection layer 23 made of such as green paint, ink, or other solder-resist materials can be formed on the first surface 22a of the routing structure 22 according to requirements to cover the routing layer 221 on the first surface 22a, such that the outer surface of the routing layer 221 is exposed from the insulating protection layer 23. For example, the outer surface of the insulating protection layer 23 is flush with the outer surface of the routing layer 221.

Figure 2D:
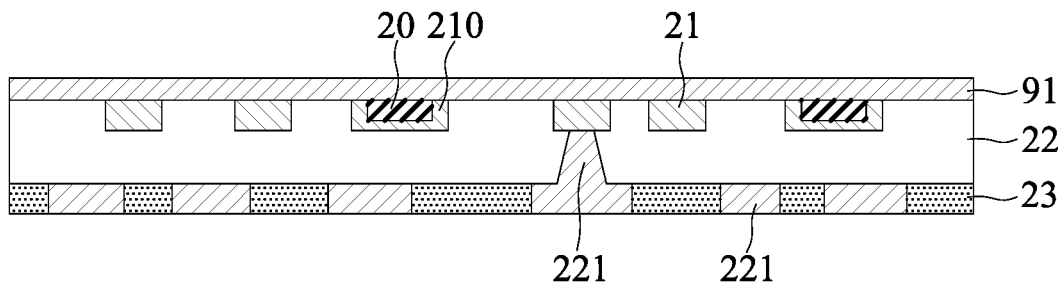
Figure 2E:
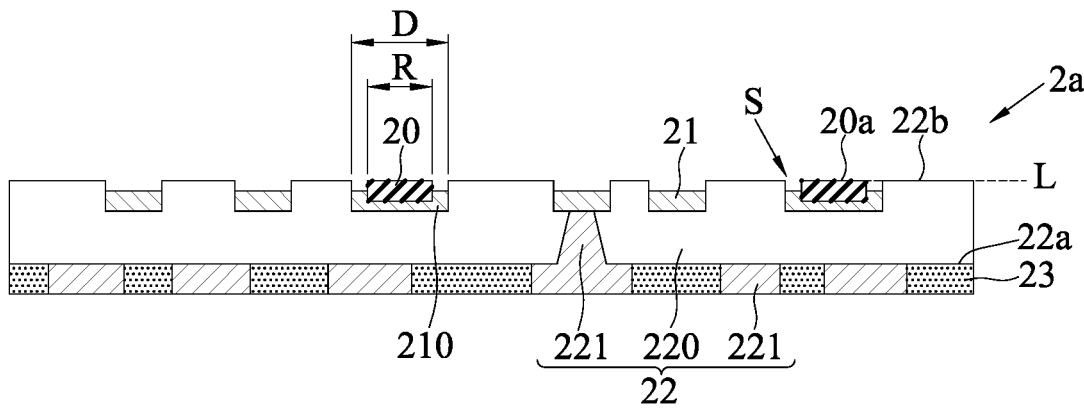

As shown in FIG. 2D and FIG. 2E, the plate body 90 of the carrier 9 is removed to expose the metal layer 91, and then the metal layer 91 is removed to obtain a plurality of packaging substrates 2a, wherein the second surface 22b of the routing structure 22, the conductive bump pads 20 and the circuit layer 21 are exposed, wherein the circuit layer 21 is embedded in the insulating layer 220, and the conductive bump pad 20 is embedded in the electrical contact pad 210 and protrudes from the electrical contact pad 210, so that the insulating layer 220 is formed with a recess S at the electrical contact pad 210.

In an embodiment, a width R of the conductive bump pad 20 is less than a width D of the electrical contact pad 210, and a pad surface 20a of the conductive bump pad 20 is flush with the second surface 22b of the routing structure 22 (or the surface of the insulating layer 220), as shown by a coplanar surface L in FIG. 2E.

Additionally, removing the metal layer 91 by etching will remove part of the material of the circuit layer 21 together, such that the circuit layer 21 recesses into the second surface 22b of the routing structure 22 (or the surface of the insulating layer 220), so that the conductive bump pad 20 protrudes from the electrical contact pad 210.

Figure 3A:
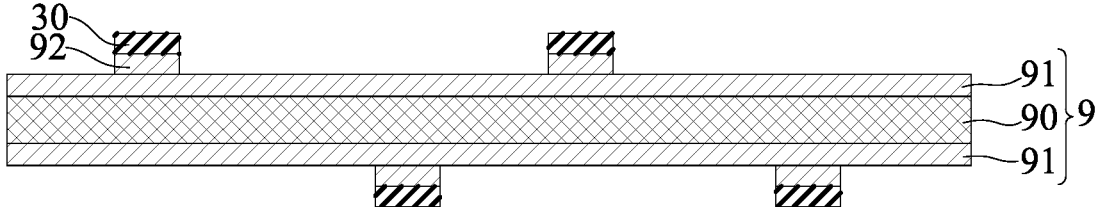
FIG. 3A to FIG. 3B are schematic cross-sectional views illustrating another method of fabricating a packaging substrate according to the present disclosure.
Figure 3B:
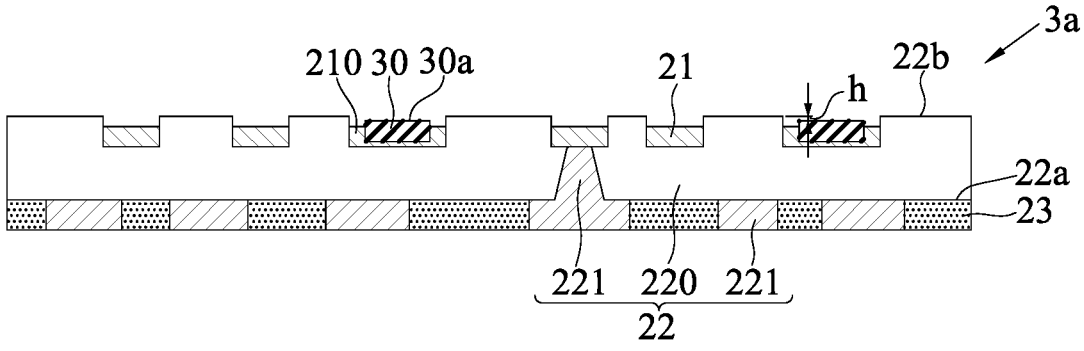

Moreover, as shown in FIG. 3A and FIG. 3B, in another embodiment, if a metal block 92 with the same material as the metal layer 91 is formed prior to the process shown in FIG. 2A, when removing the metal layer 91 by etching, the metal block 92 will be removed together, such that a conductive bump pad 30 recesses into the second surface 22b of the routing structure 22 (or the surface of the insulating layer 220). A packaging substrate 3a shown in FIG. 3B has a height difference h, so that a pad surface 30a of the conductive bump pad 30 is lower than the second surface 22b of the routing structure 22 (or the surface of the insulating layer 220), but the conductive bump pad 30 still protrudes from the electrical contact pad 210.

Figure 2F:
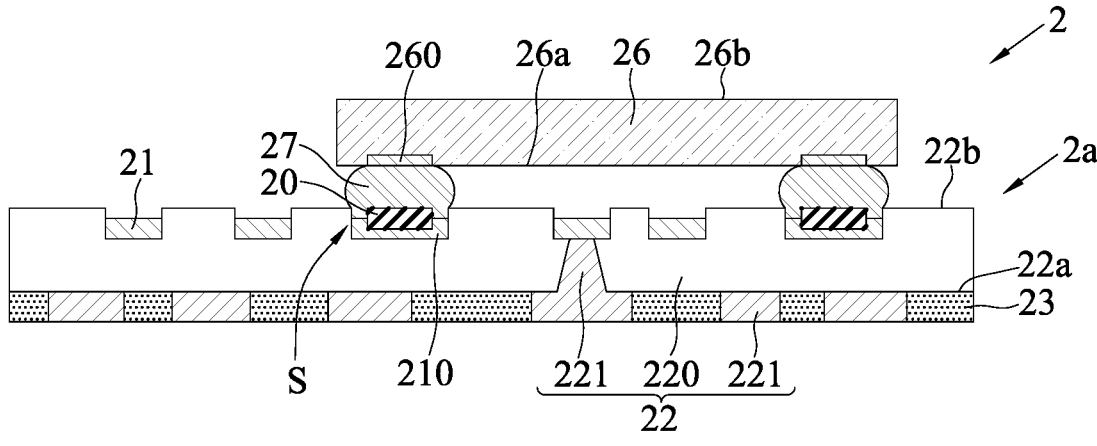

As shown in FIG. 2F, at least one electronic element 26 is arranged on the second surface 22b of the routing structure 22 of the packaging substrate 2a to form the electronic package 2, and the electronic element 26 is electrically connected to the conductive bump pads 20 and the electrical contact pads 210 via conductive bumps 27.

The electronic element 26 is an active element, a passive element, or a combination of the active element and the passive element, wherein the active element is for example a semiconductor chip, and the passive element is for example a resistor, a capacitor, or an inductor. In an embodiment, the electronic element 26 is a semiconductor chip and has an active surface 26a and an inactive surface 26b opposing the active surface 26a. A plurality of electrode pads 260 are formed on the active surface 26a, such that the electronic element 26 is flip-chip bonded onto the electrical contact pads 210 via the plurality of conductive bumps 27 by the electrode pads 260.

The conductive bump 27 is made of solder material, which is bonded to the electrode pad 260 and the electrical contact pad 210 and covers the conductive bump pad 20.

Therefore, in the fabricating method of the electronic package 2 of the present disclosure, the conductive bump pads 20 are disposed on the electrical contact pads 210, and the pad surfaces 20a are not higher than the insulating layer 220, so that when the electronic element 26 is bonded to the packaging substrate 2a, 3a via a flip-chip method, the conductive bump pads 20 can guide the flow of the solder material when reflowing the conductive bumps 27. Hence, compared with the prior art, in the fabricating process of the electronic package 2 of the present disclosure, the problem of empty soldering caused by the conductive bumps 27 not effectively contacting the electrical contact pads 210 can be avoided, and the problem of electrical short circuit caused by the conductive bump 27 connecting to two adjacent ones of the electrical contact pads 210 can also be prevented.

Figure 4:
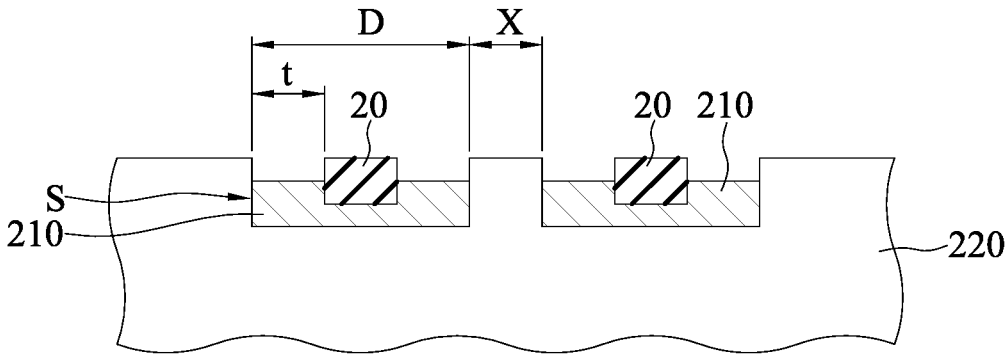
FIG. 4 is a schematic partial cross-sectional view showing a packaging substrate according to the present disclosure.

Preferably, as shown in FIG. 4, a distance t between the conductive bump pad 20 and a wall of the recess S of the insulating layer 220 is greater than one third of the width D of the electrical contact pad 210, so that the solder material is easily to flow onto the electrical contact pads 210 when reflowing the conductive bumps 27.

Preferably, a width X of the insulating layer 220 between two adjacent ones of the electrical contact pads 210 is greater than one third of the width D of the electrical contact pad 210, so that the solder material cannot flow to the adjacent electrical contact pads 210 when reflowing the conductive bumps 27. Hence, the problem of empty soldering caused by the conductive bumps 27 not effectively contacting the electrical contact pads 210 can more likely be avoided, and the problem of electrical short circuit caused by the conductive bump 27 connecting to two adjacent ones of the electrical contact pads 210 can also more likely be prevented.

The present disclosure also provides a packaging substrate 2a, 3a, which comprises: a routing structure 22, a circuit layer 21, and at least one conductive bump pad 20, 30.

The routing structure 22 has a first surface 22a and a second surface 22b opposing the first surface 22a, and the routing structure 22 comprises at least one insulating layer 220 and a routing layer 221 formed on the insulating layer 220.

The circuit layer 21 is embedded in the insulating layer 220 of the second surface 22b of the routing structure 22 and electrically connected to the routing layer 221, wherein the circuit layer 21 has a plurality of electrical contact pads 210 exposed from the insulating layer 220.

The conductive bump pad 20, 30 is disposed on at least one of the plurality of electrical contact pads 210, and a width R of the conductive bump pad 20, 30 is less than a width D of the electrical contact pad 210, wherein a material for forming the conductive bump pad 20, 30 is different from a material for forming the electrical contact pad 210.

In an embodiment, the material for forming the conductive bump pad 20, 30 is nickel, and the material for forming the electrical contact pad 210 is copper.

In an embodiment, the conductive bump pad 20, 30 is embedded in the electrical contact pad 210.

In an embodiment, the insulating layer 220 is formed with a recess S at the electrical contact pad 210, and the conductive bump pad 20, 30 is located in the recess S. For instance, a distance t between the conductive bump pad 20, 30 and a wall of the recess S is greater than one third of the width D of the electrical contact pad 210.

In an embodiment, a width X of the insulating layer 220 between two adjacent ones of the plurality of electrical contact pads 210 is greater than one third of the width D of the electrical contact pad 210.

In an embodiment, a pad surface 20a of the conductive bump pad 20 is flush with the second surface 22b of the routing structure 22.

In an embodiment, a pad surface 30a of the conductive bump pad 30 is lower than the second surface 22b of the routing structure 22.

The present disclosure also provides an electronic package 2, which comprises: the packaging substrate 2a, 3a and at least one electronic element 26 disposed on the plurality of electrical contact pads 210 via a plurality of conductive bumps 27.

The conductive bump 27 is bonded to the conductive bump pad 20, 30.

In an embodiment, the conductive bump 27 is made of solder material.

To sum up, in the electronic package, the packaging substrate and fabricating method thereof of the present disclosure, the conductive bump pads are disposed on the electrical contact pads and the pad surfaces of the conductive bump pads are not higher than the insulating layer, so that when the electronic element is bonded to the packaging substrate via a flip-chip method, the conductive bump pads can guide the flow of the solder material when reflowing the conductive bumps. Hence, in the fabricating process of the electronic package of the present disclosure, the problem of empty soldering caused by the conductive bumps not effectively contacting the electrical contact pads can be avoided, and the problem of electrical short circuit caused by the conductive bump connecting to two adjacent ones of the electrical contact pads can also be prevented.

The above embodiments are set forth to illustrate the principles of the present disclosure and the effects thereof, and should not be interpreted as to limit the present disclosure. The above embodiments can be modified by one of ordinary skill in the art without departing from the scope of the present disclosure as defined in the appended claims. Therefore, the scope of protection of the right of the present disclosure should be listed as the following appended claims.

What is claimed is:

1. A packaging substrate, comprising:
  a routing structure having a first surface and a second surface opposing the first surface, and comprising an insulating layer and a routing layer formed on the insulating layer;
  a circuit layer embedded in the insulating layer of the second surface of the routing structure and electrically connected to the routing layer, wherein the circuit layer has a plurality of electrical contact pads exposed from the insulating layer; and a conductive bump pad disposed on at least one of the plurality of electrical contact pads, wherein a width of the conductive bump pad is less than a width of each of the electrical contact pads, and a material for forming the conductive bump pad is different from a material for forming the electrical contact pads, wherein the conductive bump pad has a pad surface no higher than the second surface of the routing structure.

2. The packaging substrate of claim 1, wherein the material for forming the conductive bump pad is nickel, and the material for forming the electrical contact pads is copper.

3. The packaging substrate of claim 1, wherein the conductive bump pad is embedded in each of the electrical contact pads.

4. The packaging substrate of claim 1, wherein the insulating layer is formed with a recess at each of the electrical contact pads, and the conductive bump pad is located in the recess.

5. The packaging substrate of claim 4, wherein a distance between the conductive bump pad and a wall of the recess is greater than one third of the width of each of the electrical contact pads.

6. The packaging substrate of claim 1, wherein a width of the insulating layer between two adjacent ones of the plurality of electrical contact pads is greater than one third of the width of each of the electrical contact pads.

7. The packaging substrate of claim 1, wherein the conductive bump pad has a pad surface flush with the second surface of the routing structure.

8. The packaging substrate of claim 1, wherein the conductive bump pad has a pad surface lower than the second surface of the routing structure.

9. An electronic package, comprising:

the packaging substrate of claim 1; and an electronic element disposed on the plurality of electrical contact pads via a plurality of conductive bumps, wherein at least one of the conductive bumps is bonded to the conductive bump pad.

10. The electronic package of claim 9, wherein the conductive bumps are made of solder material.

11. A method of fabricating an electronic package, comprising:

providing the packaging substrate of claim 1; and disposing an electronic element on the plurality of electrical contact pads via a plurality of conductive bumps, wherein at least one of the conductive bumps is bonded to the conductive bump pad.

12. The method of claim 11, wherein the conductive bumps are made of solder material.

13. A method of fabricating a packaging substrate, comprising:

providing a carrier having a metal layer;

forming at least a conductive bump pad on the metal layer, wherein a material for forming the conductive bump pad is different from a material for forming the metal layer;

forming a circuit layer on the metal layer, wherein the circuit layer has a plurality of electrical contact pads, and the conductive bump pad is covered by at least one of the plurality of electrical contact pads, wherein the material for forming the conductive bump pad is different from a material for forming the electrical contact pads;

forming a routing structure on the metal layer, wherein the routing structure has a first surface and a second surface opposing the first surface, wherein the routing structure comprises an insulating layer formed on the metal layer and the circuit layer, and a routing layer formed on the insulating layer and electrically connected to the circuit layer; and removing the carrier and the metal layer thereon to expose the electrical contact pads of the circuit layer and the conductive bump pad, wherein a width of the conductive bump pad is less than a width of each of the electrical contact pads.

14. The method of claim 13, wherein the material for forming the conductive bump pad is nickel, and the material for forming the electrical contact pads is copper.

15. The method of claim 13, wherein the conductive bump pad is embedded in each of the electrical contact pads.

16. The method of claim 13, wherein the insulating layer is formed with a recess at each of the electrical contact pads, and the conductive bump pad is located in the recess.

17. The method of claim 16, wherein a distance between the conductive bump pad and a wall of the recess is greater than one third of the width of each of the electrical contact pads.

18. The method of claim 13, wherein a width of the insulating layer between two adjacent ones of the plurality of electrical contact pads is greater than one third of the width of each of the electrical contact pads.

19. The method of claim 13, wherein the conductive bump pad has a pad surface flush with the second surface of the routing structure.

20. The method of claim 13, wherein the conductive bump pad has a pad surface lower than the second surface of the routing structure.

* * * * *